(12) United States Patent
Blodgett

(10) Patent No.: US 7,342,446 B2
(45) Date of Patent: Mar. 11, 2008

(54) APPARATUS AND METHOD FOR CONTROLLING FEED-FORWARD AMPLIFIERS

(75) Inventor: James R. Blodgett, Walnut Creek, CA (US)

(73) Assignee: SOMA Networks, Inc., San Francisco, CA (US)

( * ) Notice: Subject to any disclaimer, the term of this patent is extended or adjusted under 35 U.S.C. 154(b) by 234 days.

(21) Appl. No.: 10/519,191

(22) PCT Filed: Jun. 25, 2003

(86) PCT No.: PCT/US03/19849

§ 371 (c)(1),
(2), (4) Date: Dec. 22, 2004

(87) PCT Pub. No.: WO04/001956

PCT Pub. Date: Dec. 31, 2003

(65) Prior Publication Data

US 2005/0174173 A1    Aug. 11, 2005

Related U.S. Application Data

(60) Provisional application No. 60/391,084, filed on Jun. 25, 2002.

(51) Int. Cl.
*H03F 1/32* (2006.01)

(52) U.S. Cl. .................................. 330/151; 330/149
(58) Field of Classification Search ............. 370/151, 370/149; 375/297; 455/114.3
See application file for complete search history.

(56) References Cited

U.S. PATENT DOCUMENTS

| 5,077,532 | A | | 12/1991 | Obermann et al. |
|---|---|---|---|---|
| 5,485,120 | A | * | 1/1996 | Anvari ....................... 330/151 |
| 5,570,063 | A | | 10/1996 | Eisenberg |
| 6,078,216 | A | * | 6/2000 | Proctor, Jr. ................. 330/151 |
| 6,388,515 | B1 | * | 5/2002 | Nishida ....................... 330/52 |
| 6,819,173 | B2 | * | 11/2004 | Louis et al. ................ 330/149 |

FOREIGN PATENT DOCUMENTS

| EP | 1 079 516 A | 2/2001 |
|---|---|---|
| WO | 2001/006640 A1 | 1/2001 |

OTHER PUBLICATIONS

Young Yun Woo, et al., Electrical and Electronics Engineers: "Feedforward Amplifier for WCDMA Base Stations with a New Adaptive Control Method", 2002 IEEE MTT-S International Microwave Symposium Digest (IMS 2002), Seattle, Washington, Jun. 2-7, 2002, IEEE MTT-S International Microwave Symposium, New York, NY : IEEE, US, vol. 2 of 4, Jun. 2, 2002, pp. 769-772.
Australian Government: IP Australia, Examiner's first report on Australian patent application No. 2003247621, mailed Mar. 14, 2007.
Supplementary Partial European Search Report for European Application No. EP 03 76 1291, mailed Apr. 26, 2007.

* cited by examiner

*Primary Examiner*—Henry Choe
(74) *Attorney, Agent, or Firm*—Katten Muchin Rosenman LLP

(57) ABSTRACT

An apparatus and method for operating a feed-forward amplifier in which, after the signal-cancellation and intermodulation-cancellation loops have initially been nulled, the feed-forward amplifier is operated so that both loops are controlled so as to minimize intermodulation at the output of the feed-forward amplifier.

5 Claims, 1 Drawing Sheet

APPARATUS AND METHOD FOR CONTROLLING FEED-FORWARD AMPLIFIERS

This application is a 371 of PCT/US03/19849, filed Jun. 25, 2003, which claims priority to US Provisional Application No. 60/391,084, filed Jun. 25, 2002, the entire contents of which is incorporated by reference herein.

FIELD OF THE INVENTION

The present invention relates to feed-forward amplifiers. More specifically, the present invention relates to an apparatus and method for controlling gain and phase adjustments in a feed-forward amplifier.

BACKGROUND OF THE INVENTION

One well-known form of amplifier is the feed-forward amplifier. In order to achieve linearity in a feed-forward amplifier, careful control of the amplifier circuitry is required. In particular, in feed-forward amplifiers two or more gain and phase adjusters are often employed and the taps of each of these adjusters are carefully steered to achieve linearity through the amplifier.

Within the art of feed-forward amplifiers, it is known to use detector-controller circuits, one for each gain-and-phase adjuster. Each detector-controller circuit is operable to steer the taps of its respective gain-and-phase adjuster in the feed-forward amplifier so that the main amplifier and correctional amplifier can properly cooperate in order to reduce error introduced by the main amplifier.

Detector-controller circuits used in feed-forward amplifiers use a number of different techniques to control the phase and gain adjustments in signal and intermodulation cancellation loops. Typically, the signal cancellation loop is nulled by measuring the total power at the cancellation node and adaptively minimizing it. This makes sense because the undistorted input signal is being removed (cancelled) from the composite signal. The total power will be minimized when this cancellation is a maximum. The intermodulation cancellation loop can be nulled using a number of techniques including pilot tones, intermodulation detectors, vector signal analysis, and many others.

A first order or textbook analysis of a feed-forward amplifier would suggest that only undesired distortion products should be amplified by the correction amplifier. In practice, this turns out to be neither possible nor desirable. There will always be some residue of the original undistorted signal in the correction amplifier signal. This is because (1) signal cancellation at the summing node is not perfect, and (2) the main amplifier in the signal cancellation loop will characteristically be driven into non-linearity on signal peaks, resulting in loop imbalance. Perfect cancellation could only be achieved in a perfectly linear system.

Conventional wisdom has been that the signal cancellation loop should be adjusted to yield the best overall cancellation possible, given the dynamic range of the signal used. Again, this is characteristically done by minimizing the total power at the summing node, although it may be done by other techniques such as pilot tone nulling.

The correction amplifier is typically a rather large amplifier that is sized to be able to handle the peak power demands placed upon it by the correction signal. Herein lies one of the oft-mentioned disadvantages of feed-forward amplifiers versus other approaches; the wasted power and cost of the correction amplifier.

Most well-designed feed-forward amplifiers use gain and phase adjustments in series and in front of the main amplifier in the signal cancellation loop. The most important reason for doing this is to maintain constant gain of the feed-forward amplifier in the face of drift in the main amplifier caused by factors such as temperature variation and component aging. Because the loss in the delayed path in the signal cancellation loop can generally be counted upon not to vary with temperature, placing the gain adjustment in series with the amplifier, and maintaining constant signal cancellation, will result in constant gain. This is very useful from a systems point of view, although it is not, strictly speaking, necessary.

SUMMARY OF THE INVENTION

The present invention recognizes that maximal cancellation in the signal cancellation loop is not generally desirable. An apparatus and method is disclosed to optimally imbalance the signal cancellation loop so as to improve performance by using the correction amplifier to provide some incremental power to the output of the feed-forward amplifier.

With gain and phase adjusters placed in series with the main amplifier, the inventor has found that it is possible to increase the overall output power of a feed-forward amplifier by imbalancing the signal cancellation loop. Doing so will, of course, vary the main amplifier's output power and level of intermodulation generation. The question then is, how to imbalance the signal-cancellation loop to provide the optimum combination of signal and distortion products to the correction amplifier while providing best overall performance of the feed-forward amplifier? At first glance it would appear that the gain and phase adjusters in both loops could just be adjusted to yield best performance (minimum intermodulation). However, the inventor has found that the signal cancellation loop should first be nulled using a conventional technique (i.e., minimizing total power at the summing node). There are two reasons for this. First, given no other factors, the intermodulation of the main amplifier will be minimized when the output is minimized. Therefore, from a cold start, the gain adjustment of the signal cancellation loop will be driven to minimum just to minimize intermodulation, which is not a very useful result. Second, there needs to be a minimum level of cancellation so that the signal presented to the correction amplifier does not overwhelm it and drive it into saturation.

The solution is surprisingly straightforward. First, the signal cancellation loop should be balanced by minimizing total power at the summing node. Second, the intermodulation cancellation loop should be balanced using an intermodulation detector or other conventional means for balancing the intermodulation cancellation loop. Third, a transition should be made to balancing the signal cancellation loop using the intermodulation detector. Note that then four adjustments (gain and phase in both loops) are being made based upon one measurement (intermodulation at the output of the feed-forward amplifier). The gain adjustment in the signal cancellation loop will no longer be driven to zero to minimize the intermodulation coming from the main amplifier, because in doing so, the signal to the correction amplifier would be greatly increased, resulting in greater overall intermodulation from the feed-forward amplifier. Characteristically, the drive to the main amplifier will be reduced very slightly, yielding a component of the desired signal at the input of the correction amplifier, which, when amplified will add in phase to the signal from the main amplifier. A fine balancing act is then played out, with the main and correction amplifiers driven at optimum levels to yield maximum desired signal and minimum intermodulation at the output of the feed-forward amplifier. Some slight variation in gain of the feed-forward amplifier will result from this balancing act but it is negligible from a systems point of view.

According to one aspect of the invention, there is provided a feed-forward amplifier including a signal cancellation loop and a intermodulation cancellation loop. The feed-forward amplifier is configured to operate so that on start-up the signal cancellation loop is first balanced so as to minimize signal power in the feed-forward path and thereafter is operated so as to minimize intermodulation at the output of the feed-forward amplifier.

According to another aspect of the invention, there is provided a feed-forward amplifier, including an input port, an output port, a first main path splitter, a main signal path gain and phase adjuster, a main amplifier, a second main path splitter, a main signal path delay element, a first main path coupler, a third main path splitter, an intermodulation receiver, a feed-forward signal path delay element, a feed-forward path coupler, an attenuator, a feed-forward path splitter, an SPDT switch, a signal-power detector/processor, a signal-power gain controller, a signal-power phase controller, a feed-forward signal path gain and phase adjuster, a correctional amplifier, an intermodulation detector/processor, an intermodulation gain controller, and an intermodulation phase controller.

The input of the first main path splitter is connected to the input port so that when an input signal applied to the input port it is split by the first main path splitter into a main signal and a feed-forward signal. The input of the main signal path gain and phase adjuster is connected to the first output of the first main path splitter and has a signal-power gain-control input tap and a signal-power phase-control input tap configured so that the voltage levels on the taps control the gain and phase of the main signal. The input of the main amplifier is connected to the output of the main signal path gain and phase adjuster. The input of second main path splitter is connected to the output of the main amplifier. The input of main signal path delay element is connected to the first output of the second main path splitter. The first input of first main path coupler is connected to the output of the main signal path delay element. The input of third main path splitter is connected to the output of the first main path coupler and the first output of third main path splitter is connected to the output port. The input of intermodulation receiver is connected to the second output of the third main path splitter. The input of feed-forward signal path delay element is connected to the second output of the first main path splitter imposes a delay selected to approximately match the delay in the main signal caused by the main amplifier. The first input of feed-forward path coupler is connected to the output of the feed-forward signal path delay element. The attenuator connects the second output of the second main path splitter to the second input of the feed-forward path coupler. The attenuation provided is selected so that the undistorted portion of the main signal provided to the feed-forward path coupler is approximately cancelled out by the feed-forward signal. The input of feed-forward path splitter is connected to the output of the feed-forward path coupler. The first throw of the SPDT switch is connected to the second output of the feed-forward path splitter and the second throw is connected to the output of the intermodulation receiver. The input of the signal-power detector/processor is connected to the pole of the SPDT switch. The signal-power detector/processor is configured to extract and process data from the signal presented to its input indicating how to steer the signal-power gain-control input tap and the signal-power phase-control input tap to minimize the signal presented to its input. The input of the signal-power gain controller is connected to the first output of the signal-power detector/processor. The signal-power gain controller is configured to steer the signal-power gain-control input tap in response to data provided by the signal-power detector/processor to minimize signal power at the feed-forward path splitter when the SPDT switch is set to connect the input of the signal-power detector/processor to the second output of the feed-forward path splitter and to minimize the intermodulation received by the intermodulation receiver when the SPDT switch is set to connect the input of the signal-power detector/processor to the output of the intermodulation receiver. The input of the signal-power phase controller is connected to the second output of the signal-power detector/processor. The signal-power phase controller is configured to steer the signal-power phase-control input tap in response to data provided by the signal-power detector/processor to minimize signal power at the feed-forward path splitter when the SPDT switch is set to connect the input of the signal-power detector/processor to the second output of the feed-forward path splitter and to minimize the intermodulation received by the intermodulation receiver when the SPDT switch is set to connect the input of the signal-power detector/processor to the output of the intermodulation receiver. The input of the feed-forward signal path gain and phase adjuster is connected to the first output of the feed-forward path splitter. The feed-forward signal path gain and phase adjuster has a gain-control input tap and a phase-control input tap. The input of the correctional amplifier is connected to the output of the feed-forward signal path gain and phase adjuster. The output is connected to the second input of the first main path coupler. The main signal path delay element provides a delay approximately equal to the delay in the correctional amplifier. The input of the intermodulation detector/processor is connected to the output of the intermodulation receiver. The intermodulation detector/processor is configured to extract and process data from the signal presented to its input indicating how to steer the intermodulation gain-control input tap and the intermodulation phase-control input tap to minimize the signal presented to its input. The input of intermodulation gain controller is connected to the first output of the intermodulation detector/processor. The intermodulation gain controller steers the intermodulation gain-control input tap in response to data provided the intermodulation detector/processor to minimize intermodulation received by the intermodulation receiver. The input of intermodulation phase controller is connected to the first output of the intermodulation detector/processor. The intermodulation phase controller steers the intermodulation phase-control input tap in response to data provided the intermodulation detector/processor to minimize intermodulation received by the intermodulation receiver. Upon startup of the feed-forward amplifier, the SPDT switch is set so as to connect the feed-forward path splitter to the signal-power detector/processor until the total power in the feed-forward path is minimized and the intermodulation received by the intermodulation receiver is minimized, and then set so as to connect the intermodulation receiver to the signal-power detector/processor.

According to another aspect of the invention, there is provided a method for operating a feed-forward amplifier having a signal cancellation loop and a intermodulation cancellation loop. On startup, the feed-forward amplifier is operated so that the signal cancellation loop is balanced so as to minimize signal power in the feed-forward path. Then, the feed-forward amplifier is operated so as to minimize intermodulation at the output of the feed-forward amplifier.

According to another aspect of the invention, there is provided a method for operating a feed-forward amplifier having a signal cancellation loop including a first gain and phase adjuster, a main amplifier forming a portion of a main signal path, and a feed-forward signal path output for providing a feed-forward signal, and an intermodulation cancellation loop connected to the feed-forward signal path output, including a second gain and phase adjuster, a correctional amplifier, and a correctional coupler for coupling the output of the correctional amplifier to the main signal path downstream of the main amplifier. The first gain and phase adjuster is steered so as to minimize signal power at the feed-forward signal path output and the second gain and phase adjuster is steered so as to minimize intermodulation downstream of the coupler. Then, when the signal power at the feed-forward signal path output and the intermodulation downstream of the correctional coupler reach minima, both of the gain and phase adjusters are steered so as to minimize the intermodulation downstream of the correctional coupler.

BRIEF DESCRIPTION OF THE DRAWINGS

A preferred embodiment of the present invention will now be described, by way of example only, with reference to the attached FIGURE, wherein.

DETAILED DESCRIPTION OF THE INVENTION

Figure 1:
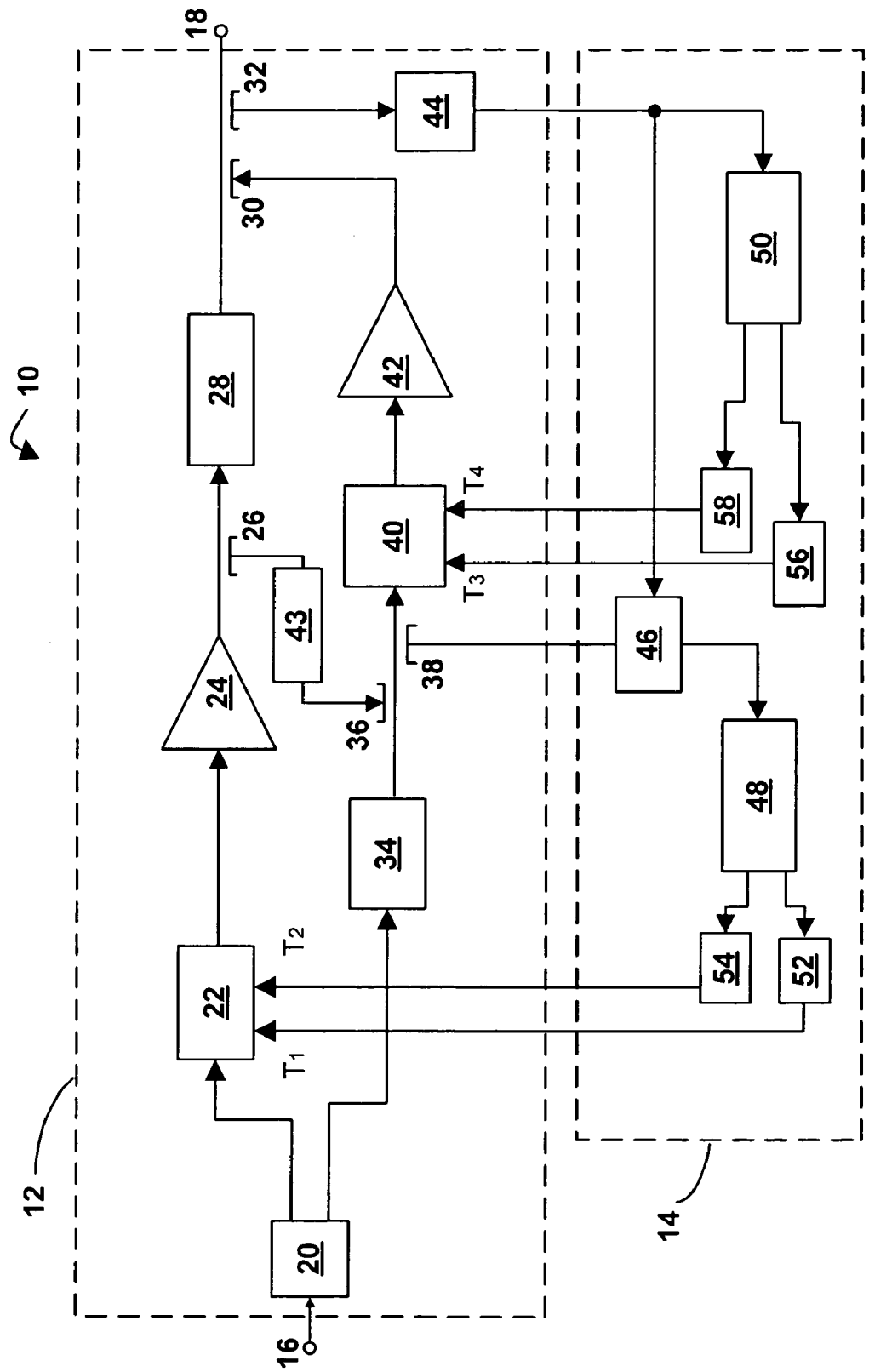
FIG. 1 is a block diagram of a feed-forward amplifier in accordance with an embodiment of the present invention.

Referring now to FIG. 1, a feed-forward amplifier in accordance with an embodiment of the invention is indicated generally by reference numeral 10. The feed-forward amplifier 10 comprises an amplifier portion 12 and a detector-controller portion 14.

The amplifier portion 12 has an input port 16 and an output port 18. A main signal path runs between the input port 16 and the output port 18 and consists of a series connection of a first main path splitter 20, a main signal path gain and phase adjuster 22, a main amplifier 24, a second main path splitter 26, a main signal path delay element 28, a first main path coupler 30, and a third main path splitter 32.

While one output of first main path splitter 20 continues along the main signal path, the other output of first main path splitter 20 heads along a feed-forward path consisting of a feed-forward signal path delay element 34, a feed-forward path coupler 36, a feed-forward path splitter 38, a feed-forward signal path gain and phase adjuster 40, and a correctional amplifier 42. The output of the correctional amplifier 42 leads to an input of the second main path coupler 30. An output of the second main path splitter 26 is connected to an input of the feed-forward path coupler 36, by an attenuator 43.

The main signal path gain and phase adjuster 22 has a gain-control input tap $T_1$ and a phase-control input tap $T_2$. Similarly, the feed-forward signal path gain and phase adjuster 40 has a gain-control input tap $T_3$ and a phase-control input tap $T_4$. In each case, the gain-control input tap $T_1$, $T_3$ can be steered to control the amplitude and the phase-control input tap $T_2$, $T_4$ can be steered to control the phase of the signal passing through the respective gain and phase adjuster. As used herein, the terms "steer", "steered" and "steering" are intended to comprise all suitable methods of adjusting or controlling of the taps of a gain and phase adjuster.

Also included in the amplifier portion 12 is an intermodulation receiver 44, the input of which is connected to the third main path splitter 32.

The detector-controller portion 14 includes an SPDT switch 46, one throw of which is connected to an output of the feed-forward path splitter 38 and the other throw of which is connected to the output of the intermodulation receiver 44. The detector-controller portion 14 also includes a signal-power detector/processor 48 and an intermodulation detector/processor 50, each detector/processor having an input and two outputs. The input of the signal-power detector/processor 48 is connected to the pole of the SPDT switch 46. The input of the intermodulation detector/processor 50 is connected to the output of the intermodulation receiver 44. It should be noted that the signal-power detector/processor 48 thereby receives either a signal from the output of the feed-forward path splitter 38 or a signal from the output of the intermodulation receiver 44, depending upon the setting of the SPDT switch 46. Further, in the present embodiment of the invention, the SPDT switch 46 is implemented in firmware in a digital signal processor. The intermodulation detector/processor 50, of course, always receives the output of the intermodulation receiver 44.

One output of the signal-power detector/processor 48 is connected to the input of a signal-power gain controller 52 and the other to the input of a signal-power phase controller 54. The output of the signal-power gain controller 52 is connected to the gain-control input tap $T_1$ and the output of the signal-power phase controller 54 is connected to the phase-control input tap $T_2$. Similarly, the outputs of the intermodulation detector/processor 50 are connected to the inputs of an intermodulation gain controller 56 and an intermodulation phase controller 58, respectively. The output of the intermodulation gain controller 56 is in turn connected to the gain-control input tap $T_3$ and the output of the intermodulation phase controller 58 is connected to the phase-control input tap $T_4$.

Those skilled in the art will recognize the feed-forward amplifier 10 differs from conventional feed-forward amplifiers primarily in the presence of the SPDT switch 46. When the SPDT switch 46 connects the signal-power detector/processor 48 to an output of the feed-forward path splitter 38, the feed-forward amplifier 10 will operate in the following conventional manner. An input signal applied to the input port 16 is split by the first main path splitter 20 into the main-signal path and the feed-forward path. The portion of the input signal proceeding down the main signal path passes through the gain and phase adjuster 22 and is then amplified by the main amplifier 24. Non-linearity in the main amplifier 24 may add distortion to the amplified signal. A portion of the signal coming out of the main amplifier 24 is split from the main signal path by the second main path splitter 26, attenuated by the attenuator 43, and coupled into the feed-forward path by the feed-forward path coupler 36. Meanwhile, the portion of the input signal proceeding down the feed-forward path from the first main path splitter 20 has passed through the feed-forward signal path delay element 34 before entering the feed-forward path coupler 36. The delay imposed by the feed-forward signal path delay element 34 is chosen in the design of the feed-forward amplifier 10 to approximately match the delay caused by the main amplifier 24 in the main signal path. Further, the attenuation provided by the attenuator 43 is chosen so that the portion of the attenuated signal due to the input signal approximately cancels out the signal entering the feed-forward path coupler 36 from the feed-forward signal path delay element 34. Alternatively, the attenuation provided by the attenuator 43 may be provided in the second main path splitter 26, in which case attenuator 43 would not be needed. The net result is that the signal at the feed-forward path splitter 38 is predominately distortion introduced by the main amplifier 24. However, some of the input signal will generally also be present at the feed-forward path splitter 38 unless the delay imposed by the feed-forward signal path delay element 34 and the attenuation provided by the attenuator 43 are precisely correct. Even if the delay and attenuation are correctly chosen initially, the main amplifier 24 will inevitably drift due to temperature changes, aging, etc.

It is well-known to correct for such drift in the main amplifier 24 by adding a gain and phase adjuster such as the main signal path gain and phase adjuster 22 to the main signal path upstream of the main amplifier 24 so that the input signal remaining at the feed-forward path splitter 38 can be minimized. Alternatively, a gain and phase adjuster may be added in the feed-forward path upstream of the feed-forward path coupler 36 or in series or in place of the attenuator 43 to accomplish the same result. Assuming that the SPDT switch 46 is set so as to connect the feed-forward path splitter 38 to the signal-power detector/processor 48, the signal present at the feed-forward path splitter 38 is presented to the signal-power detector/processor 48. The signal-power detector/processor 48 measures the total power of the signal applied to it and instructs the signal-power gain controller 52 and the signal-power phase controller 54 to steer the gain-control input tap $T_1$ and the phase-control input tap $T_2$ so as minimize the total power measured by the signal-power detector/processor 48. The result will tend to be that the portion of the input signal present at the feed-forward path splitter 38 will be minimized. The details of how the signal-power gain controller 52 and the signal-power phase controller 54 determine how to steer the gain-control input tap $T_1$ and the phase-control input tap $T_2$ is outside the scope of the invention; those skilled in the art will be aware of numerous algorithms for so doing.

Meanwhile, the signal at the feed-forward path splitter 38, which is predominately distortion introduced by the main amplifier 24 passes through the feed-forward signal path gain and phase adjuster 40, is amplified by the correctional amplifier 42, and is presented to an input of the second main path coupler 30. The signal from the feed-forward path will be approximately a polarity-reversed copy of the distortion introduced by the main amplifier 24 and which will approximately cancel out the distortion present in the main signal. To increase the cancellation, the third main path splitter 32 splits the main signal downstream of the second main path coupler 30 and presents a portion of that signal to the intermodulation receiver 44, which in turn provides the intermodulation distortion present in that signal to the intermodulation detector/processor 50. The intermodulation detector/processor 50 instructs the intermodulation gain controller 56 and the intermodulation phase controller 58 to steer the gain-control input tap $T_3$ and the phase-control input tap $T_4$ so as minimize the intermodulation received by the intermodulation receiver 44. The details of how the intermodulation gain controller 56 and the intermodulation phase controller 58 determine how to steer the gain-control input tap $T_3$ and the phase-control input tap $T_4$ is outside the scope of the invention; those skilled in the art will be aware of numerous algorithms for so doing.

The operation of the feed-forward amplifier 10 as described above (assuming the SPDT switch 46 is set so as to connect the feed-forward path splitter 38 to the signal-power detector/processor 48) is conventional. However, the inventor has found that by operating the feed-forward amplifier 10 in the following unconventional manner significantly greater overall gain can be achieved. First, the feed-forward amplifier 10 should be powered up. The total power measured by the signal-power detector/processor 48 and the intermodulation distortion measured by the intermodulation detector/processor 50 should be minimized in the conventional manner as described above. However, the SPDT switch 46 should then operated to connect intermodulation receiver 44 to the signal-power detector/processor 48. From then on the signal-power detector/processor 48 will instruct the signal-power gain controller 52 and a signal-power phase controller 54 to steer the gain-control input tap $T_1$ and the phase-control input tap $T_2$ so as minimize the intermodulation received by the intermodulation receiver 44 rather than total power at feed-forward path splitter 38. It should be noted that the intermodulation detector/processor 50 will simultaneously be instructing the intermodulation gain controller 56 and the intermodulation phase controller 58 to steer the gain-control input tap $T_3$ and the phase-control input tap $T_4$ so as minimize the intermodulation received by the intermodulation receiver 44.

The inventor has found that it is advisable to reduce how fast the controllers 52, 54, 56, 58 attempt to null the loops in order to maintain stability after the SPDT switch 46 has been switched so as to route the output of the intermodulation receiver 44 to the signal-power detector/processor 48. Conventionally, the algorithms used in the controllers 52, 54, 56, 58 include fixed step sizes for changes to gain or phase. The inventor suggests that the step sizes used by the gain controllers 52, 56 and the signal-power phase controllers 54, 58 in varying the settings of the gain-control input taps $T_1$, $T_3$ and the phase-control input tap $T_2$, $T_4$ be reduced after the SPDT switch 46 has been switched so as to route the output of the intermodulation receiver 44 to the signal-power detector/processor 48.

The end result of applying to invention to the feed forward amplifier 10 has been found to be that complete input signal cancellation does not take place at the feed-forward path splitter 38 and the gain of the main amplifier 24 is reduced slightly, causing the portion of the input signal present at the feed-forward path splitter 38 to be less than the feed-forward signal coming from the feed-forward signal path delay element 34. As a result, a portion of the signal presented to the input port 16 enters the correctional amplifier 42 and is amplified and added in phase to the main path signal at the first main path coupler 30.

The embodiment of the invention described above has been tested and found to provide approximately 1 dB higher output power for the same intermodulation distortion as compared to a feed-forward amplifier that minimizes power at the signal-cancellation node and intermodulation at the output of the amplifier. In addition to higher output power, efficiency was improved. Those skilled in the art will recognize that these results are remarkable, given the lengths to which one must go to get tenths of a dB, and the cost of providing those tenths of a dB.

Those skilled in the art of feed-forward amplifier design will also understand that the invention may be applicable to increase the overall gain of other types of feed-forward amplifiers that use performance-measuring means for nulling the signal and intermodulation-cancellation loops.

The above-described embodiments of the invention are intended to be examples of the present invention and alterations and modifications may be effected thereto by those of skill in the art without departing from the scope of the invention that is defined solely by the claims appended hereto.

I claim:

1. A feed-forward amplifier, comprising:
   an amplifier portion including a main signal path, a feed-forward signal path, a signal cancellation loop, and an intermodulation cancellation loop; and
   a detector-controller portion including a signal-power detector/processor, and a switch,
   wherein the switch operates (i) on start-up to couple the signal-power detector/processor to the signal cancellation loop so that it balances the signal cancellation loop so as to minimize signal power in the feed-forward signal path, and (ii) thereafter operates to couple the signal-power detector/processor to the main signal path downstream of the intermodulation cancellation loop so as to operate the signal cancellation loop to minimize intermodulation in the main signal path downstream of the intermodulation cancellation loop.

2. The feed-forward amplifier of claim 1, wherein the main signal path includes:
   an input port;
   an output port;
   a first main path splitter, an input of which is connected to the input port so that when an input signal applied to the input port it is split by the first main path splitter into a main signal and a feed-forward signal;
   a main signal path gain and phase adjuster, an input of which is connected to a first output of the first main path splitter, the main signal path gain and phase adjuster having a gain-control input tap $T_1$ and a phase-control input tap $T_2$ configured so that the voltage levels on the taps control the gain and phase of the main signal;
   a main amplifier, an input of which is connected to the output of the main signal path gain and phase adjuster;
   a second main path splitter, an input of which is connected to an output of the main amplifier;
   a main signal path delay element, an input of which is connected to a first output of the second main path splitter;
   a first main path coupler, a first input of which is connected to an output of the main signal path delay element; and
   a third main path splitter, an input of which is connected to an output of the first main path coupler and a first output of which is connected to the output port and a second output of which is connected to an input of an intermodulation receiver,
   wherein the feed-forward signal path includes:
      a feed-forward signal path delay element, an input of which is connected to a second output of the first main path splitter, the delay imposed by the feed-forward signal path delay element selected to approximately match the delay in the main signal caused by the main amplifier;
      a feed-forward path coupler, a first input of which is connected to an output of the feed-forward signal path delay element and a second input of which is connected to an attenuator connected to a second output of the second main path splitter, the attenuation selected so that the undistorted portion of the main signal provided to the feed-forward path coupler is approximately cancelled out by the feed-forward signal;
      a feed-forward path splitter, an input of which is connected to an output of the feed-forward path coupler;
      a feed-forward signal path gain and phase adjuster, an input of which is connected to a first output of the feed-forward path splitter, the feed-forward signal path gain and phase adjuster having a gain-control input tap $T_3$ and a phase-control input tap $T_4$; and
      a correctional amplifier, an input of which is connected to the output of the feed-forward signal path gain and phase adjuster and an output of which is connected to a second input of the first main path coupler,
      wherein the delay in the correctional amplifier is approximately equal to the delay added by the main signal path delay element, and
   wherein the detector-controller portion includes:
   the switch, which comprises a SPDT switch, the first throw of which is connected to an output of the intermodulation receiver and the second throw of which is connected to a second output of feed-forward signal path gain and phase adjuster;
   the signal-power detector/processor, an input of which is connected to the pole of the SPDT switch, the signal-power detector/processor configured to extract and process data from the signal presented to its input indicating how to steer the gain-control input tap $T_1$ and the phase-control input tap $T_2$ to minimize the signal presented to its input;
   a signal-power gain controller, an input of which is connected to a first output of the signal-power detector/processor, the signal-power gain controller configured to steer the gain-control input tap $T_1$ in response to data provided by the signal-power detector/processor to minimize signal power at the feed-forward path splitter when the SPDT switch is set to connect the input of the signal-power detector/processor to the second output of the feed-forward path splitter and to minimize the intermodulation received by the intermodulation receiver when the SPDT switch is set to connect the input of the signal-power detector/processor to the output of the intermodulation receiver;
   a signal-power phase controller, an input of which is connected to a second output of the signal-power detector/processor, the signal-power phase controller configured to steer the phase-control input tap $T_2$ in response to data provided by the signal-power detector/processor to minimize signal power at the feed-forward path splitter when the SPDT switch is set to connect the input of the signal-power detector/processor to the second output of the feed-forward path splitter and to minimize the intermodulation received by the intermodulation receiver when the SPDT switch is set to connect the input of the signal-power detector/processor to the output of the intermodulation receiver;
   an intermodulation detector/processor, an input of which is connected to the output of the intermodulation receiver, the intermodulation detector/processor configured to extract and process data from the signal presented to its input indicating how to steer the gain-control input tap $T_3$ and the phase-control input tap $T_4$ to minimize the signal presented to its input;

an intermodulation gain controller, an input of which is connected to a first output of the intermodulation detector/processor and which steers the gain-control input tap $T_3$ in response to data provided the intermodulation detector/processor to minimize intermodulation received by the intermodulation receiver; and an intermodulation phase controller, an input of which is connected to a second output of the intermodulation detector/processor and which steers the phase-control input tap $T_4$ in response to data provided the intermodulation detector/processor to minimize intermodulation received by the intermodulation receiver, wherein, upon startup of the feed-forward amplifier, the SPDT switch is set so as to connect the feed-forward path splitter to the signal-power detector/processor until the total power in the feed-forward path and the intermodulation received by the intermodulation receiver are minimized, and then set so as to connect the intermodulation receiver to the signal-power detector/processor.

3. A method for operating a feed-forward amplifier having a signal cancellation loop and a intermodulation cancellation loop, comprising:

on startup, operating the feed-forward amplifier so that the signal cancellation loop is balanced so as to minimize signal power in the teed-forward amplifier's feed-forward path while the intermodulation cancellation loop is operated so as to minimize intermodulation at the feed-forward amplifier's output; and then, when signal power in the feed-forward path and intermodulation at the feed-forward amplifier's output have both been minimized, operating the signal cancellation loop so as to minimize intermodulation at the feed-forward amplifier's output while continuing to operate the intermodulation cancellation loop so as to minimize intermodulation at feed-forward amplifier's output.

4. A method for operating a feed-forward amplifier having a signal cancellation loop including a first gain and phase adjuster and a main amplifier forming a portion of the feed-forward amplifier's main signal path, and an intermodulation cancellation loop, including a second gain and phase adjuster, a correctional amplifier, and a correctional coupler for coupling the output of the correctional amplifier to the main signal path downstream of the main amplifier, the method comprising:

steering the first gain and phase adjuster so as to minimize signal power in the feed-forward amplifier's feed-forward signal path and the second gain and phase adjuster so as to minimize intermodulation downstream of the correctional coupler; and then, when the signal power in the feed-forward signal path and the intermodulation downstream of the correctional coupler have both reach minimums, steering both of the gain and phase adjusters so as to minimize the intermodulation downstream of the correctional coupler.

5. The feed-forward amplifier of claim 1, wherein the amplifier portion has an input port and an output port and includes:

the main signal path connecting the input port to the output port and including a gain and phase adjuster, the main amplifier, and a delay element downstream of the main amplifier and the gain and phase adjuster; and the feed-forward signal path having an input connected to the input port, an output coupled to the main signal path at a coupler between the delay element and the output port, a delay element, a gain and phase adjuster, and a correctional amplifier;

an intermodulation receiver coupled to the main signal path at a path splitter between the coupler at the output of the feed-forward signal path and the output port; and an attenuator coupled to the main signal path at a path splitter that is downstream of the main amplifier and the gain and phase adjuster and upstream of the delay element and coupled to the feed-forward signal path at a coupler that is downstream of the delay element and upstream of the gain and phase adjuster and the correctional amplifier; and the detector-controller portion includes:

the signal-power detector/processor, an output of which is connected to the gain and phase adjuster in the main signal path so that the signal-power detector/processor controls the gain and phase of a main signal amplified in the main signal path; and an intermodulation detector/processor, an input of which is connected to the intermodulation receiver and an output of which is connected to the gain and phase adjuster in the feed-forward signal path so that the intermodulation detector/processor controls the gain and phase of the feed-forward signal so as to minimize intermodulation at the output port of the feed-forward amplifier;

wherein the detector-controller portion also includes a switch which on start-up of the feed-forward amplifier connects an input of the signal-power detector/processor to the feed-forward signal path at a splitter downstream of the coupler of the attenuator to the feed-forward signal path and upstream of the gain and phase adjuster and the correctional amplifier so that the signal-power detector/processor controls the gain and phase of the main signal so as to minimize signal power in the feed-forward signal path and then, after signal power in the feed-forward signal path and intermodulation at the output port have both been minimized, disconnects the input of the signal-power detector/processor from the feed-forward signal path and connects the input of the signal-power detector/processor to the intermodulation receiver so that the signal-power detector/processor controls the gain and phase of the main signal so as to minimize intermodulation at the output port of the feed-forward amplifier.

* * * * *